United States Patent [19]

Daigle et al.

[11] Patent Number: 5,440,805
[45] Date of Patent: * Aug. 15, 1995

[54] METHOD OF MANUFACTURING A MULTILAYER CIRCUIT

[75] Inventors: Robert C. Daigle, Sterling; W. David Smith, Abington, both of Conn.; John A. Olenick, Brockport, N.Y.; David J. Arthur, Norwood; Gwo S. Swei, Northboro, both of Mass.

[73] Assignee: Rogers Corporation, Rogers, Conn.

[ * ] Notice: The portion of the term of this patent subsequent to Jan. 4, 2011 has been disclaimed.

[21] Appl. No.: 127,975

[22] Filed: Sep. 27, 1993

Related U.S. Application Data

[63] Continuation-in-part of Ser. No. 847,895, Mar. 9, 1992, Pat. No. 5,287,619.

[51] Int. Cl.⁶ .............................................. H05K 3/36
[52] U.S. Cl. ...................................... 29/830; 29/846; 29/852; 174/262
[58] Field of Search ................. 29/830, 846, 852, 848; 174/262; 156/902

[56] References Cited

U.S. PATENT DOCUMENTS

| | | |
|---|---|---|
| 3,835,531 | 9/1974 | Luttmer . |
| 3,953,924 | 5/1976 | Zachry et al. . |
| 4,075,757 | 2/1978 | Malm et al. . |
| 4,159,222 | 6/1979 | Lebow et al. . |
| 4,306,925 | 12/1981 | Lebow et al. . |
| 4,446,477 | 5/1984 | Currie et al. . |
| 4,634,631 | 1/1987 | Gazit et al. . |
| 4,640,866 | 2/1987 | Suzuki ............................ 428/901 X |
| 4,647,508 | 3/1987 | Gazit et al. . |
| 4,667,220 | 5/1987 | Lee et al. . |
| 4,685,210 | 8/1987 | King et al. . |
| 4,692, 839 | 9/1987 | Lee et al. . |
| 4,702,792 | 10/1987 | Chow et al. . |
| 4,755,911 | 7/1988 | Suzuki et al. .................... 428/901 X |
| 4,788,766 | 12/1988 | Burger et al. . |
| 4,810,332 | 3/1989 | Pan . |
| 4,816,323 | 3/1989 | Inoue . |
| 4,818,728 | 4/1989 | Rai et al. . |
| 4,849,284 | 7/1989 | Arthur et al. . |

(List continued on next page.)

FOREIGN PATENT DOCUMENTS

| | | |
|---|---|---|
| 0310357 | 4/1989 | European Pat. Off. . |
| 0446656A1 | 9/1991 | European Pat. Off. . |
| 0560077A2 | 9/1993 | European Pat. Off. . |
| 63-274199 | 11/1988 | Japan . |
| 2049297A | 12/1980 | United Kingdom . |
| WO87/00390 | 1/1987 | WIPO . |

OTHER PUBLICATIONS

IBM Technical Disclosure Bulletin; vol. 11, No. 12, May 1969, New York, US, pp. 1676–1677.

International Journal of Microcircuits and Electronic Packaging, vol. 16, No. 2, Second Quarter 1993, Reston, Va., US, pp. 109–116; G. S. Swei et al., "Ultra Thin Fluoropolymer Dielectrics for MCM-L".

J. Tony Pan, Steve Poon, and Brad Nelson, A Planar Approach to High Density Copper-Polyimide Interconnect Fabrication.

J. Tony Pan, High Density Multi-Level Copper Polyimide Interconnects.

(List continued on next page.)

Primary Examiner—Carl J. Arbes
Attorney, Agent, or Firm—Fishman, Dionne & Cantor

[57] ABSTRACT

In accordance with the present invention, a circuit assembly is manufactured in an additive process using at least one layer of a fluoropolymer composite material and a conductive material. The conductive layers are plated, and the fluoropolymer composite layers are laminated. The use of the filled fluoropolymeric composite eliminates the need for a barrier metal layer between the insulation and the conductors. A plurality of these circuit assemblies are stacked, one on top of the other. At least, selected exposed locations of the conductive material comprise a diffusible conductive material (e.g., gold). Once stacked the circuit assemblies are subjected to lamination under heat and pressure to simultaneously fuse adjacent fluoropolymer composite material and diffuse adjacent diffusible conductive material together to form an integral multilayer circuit having solid conductive interconnects.

36 Claims, 6 Drawing Sheets

U.S. PATENT DOCUMENTS

| | | |
|---|---|---|
| 4,868,350 | 9/1989 | Hoffarth et al. . |
| 4,874,721 | 10/1989 | Kimura et al. . |
| 4,902,606 | 2/1990 | Patraw . |
| 4,915,983 | 4/1990 | Lake et al. ............... 427/97 X |
| 4,922,377 | 5/1990 | Matsumoto et al. . |
| 4,926,241 | 5/1990 | Carey . |
| 4,958,258 | 9/1990 | Charruan . |
| 4,995,941 | 2/1991 | Nelson et al. . |
| 5,010,641 | 4/1991 | Sisler ............... 428/901 X |
| 5,011,580 | 4/1991 | Pan et al. . |
| 5,023,921 | 6/1991 | Goutte et al. . |
| 5,030,499 | 7/1991 | Shaheen et al. . |
| 5,046,238 | 9/1991 | Daigle et al. . |
| 5,049,974 | 9/1991 | Nelson et al. . |
| 5,055,425 | 10/1991 | Leibovitz et al. . |
| 5,061,548 | 10/1991 | Arthur et al. . |
| 5,097,393 | 3/1992 | Nelson et al. . |
| 5,129,142 | 7/1992 | Bindra et al. ............... 29/852 |
| 5,274,912 | 1/1994 | Olenick et al. ............... 29/846 X |
| 5,309,629 | 5/1994 | Traskos et al. ............... 29/830 |
| 5,329,695 | 7/1994 | Traskos et al. ............... 29/830 |

OTHER PUBLICATIONS

Peter Dunbeck, Digital's Multichip Unit: The Performance Packaging Answer, Electronic Design, Aug. 23, 1990, p. 79.

Takaaki Ohsaki, Toyoshi Yasuda, Satoru Yamaguchi and Taichi Kon, A Fine–Line Multilayer Substrate with Photo–Sensitive Polymide Dielectric and Electroless Copper Plated Conductors, 1987, IEEE, pp. 178–183.

MCMs Tech. Rept. No. ILO–007–90–P, Accommodate Multiple via Structures, Japanese Packaging and Interconnect Technology Overview, (1990).

METHOD OF MANUFACTURING A MULTILAYER CIRCUIT

This application is a continuation-in-part of U.S. Patent Ser. No. 847,895 entitled Multichip Module Substrate and Method of Manufacture Thereof filed Mar. 9, 1992, now U.S. Pat. No. 287,619.

BACKGROUND OF THE INVENTION

This invention relates generally to methods of manufacturing multilayer circuit boards and multichip modules, referred to collectively herein as circuits. More particularly, this invention relates to new and improved methods of manufacturing multilayer circuits wherein interconnections between multichip module assemblies (circuit assemblies) is accomplished in a single lamination step utilizing a fluoropolymer composite material and diffusible conductive material (e.g. a noble metal).

The need for and desirability of substrates for MCM's is well known in the electronic industry. The need for increased density in I/C packaging, increased interconnection capacity, and improved interconnection performance is well known among those involved in VLSI packaging and elsewhere in the electronics industry.

A multichip module can be viewed as a packaging technique in which several I/C chips, which may include complex microprocessor chips, memory chips, etc., are interconnected by a high density substrate. Although substrates for MCMs have been known in general for several years, these known prior art substrates for MCMs typically use thin film polyimide based material systems, and those systems have known deficiencies. Polyimide dielectric materials suffer from poor thermo-mechanical reliability and stability and electrical performance limitations. The polyimide materials usually are thermosetting, and have high elastic modulus, and there is a significant mismatch, i.e., difference, between the coefficient of thermal expansion (CTE) of the polyimide and the copper-conductors and/or other elements of the circuit structures. That all results in high stresses in the polyimide material and in surrounding materials and interfaces during thermal excursions in either or both the manufacturing process for or during use of the MCM substrate. Those stresses can lead to dimensional instabilities, cracking, delamination and other thermomechanically related problems. Also, the chemical bond between the polyimide and the copper conductors may be weak and is usually sensitive to the presence of water, thus leading to poor reliability of the copper-polyimide interface.

In some manufacturing processes for polyimide-based substrates for MCMs, a liquid form polyimide precursor is applied and then cured; in other processes, a sheet form polyimide prepreg is used. In either case, it is difficult to keep water out of the MCM substrate structure made with polyimides. Water is often generated during the polyimide cure, and the polyimide equilibrium water absorption is substantial, often in excess of 1%, and the rate of water uptake can be high. Also, water diffusion rates in polyimides are often high, so any water in a polyimide MCM substrate structure can diffuse quickly to the polyimide-conductor interface to corrode or otherwise degrade the interface. To combat this interface problem, a layer of metal, usually chromium is used as a barrier layer between the polyimide and the copper conductors. While this use of a barrier layer can be successful, it adds significant and expensive processing steps and costs to the manufacture of the MCM substrate structure.

Another point to note about polyimide based substrates for MCMs is that they are thin film structures. The layers of polyimide are typically in the range of 5 to 12 microns in thickness, with conductor line thickness in the range of 2 to 7 microns. Those relatively thin conductor lines mean relatively high resistance and relatively high loss; and both the nature of the polyimide material, per se, and the relatively thin layers used, result in poor electrical insulation characteristics.

Multilayer circuits are also well known and comprise a plurality of stacked substrate/circuit trace assemblies with interconnections between selected locations on the spaced circuit traces. Conventional manufacturing techniques for multilayer circuits generally do not yield multiple levels of interconnect, i.e. easy interconnection from one layer to any other layer without significant loss of density and/or major increases in processing costs. This limits the circuit density and the number of substrates. When multiple interconnect levels are required, step intensive sequential process techniques are usually utilized with much reduced yields.

U.S. Pat. No. 4,788,766 attempts to overcome these problems. This prior patent discloses a method wherein a multilayer assembly is made up of a number of individual circuit boards and each board has a substrate on which a first conductive layer is formed on one surface while a second conductive layer is formed on the opposite surface. The substrate is a dielectric material which insulates the conductive layers. Via holes are formed through the first conductive layer, the substrate and the second conductive layer at various locations. An outer conductive material, such as copper, is applied over the first and second conductive layers and onto the side walls of the holes. A conductive bonding material is then deposited onto the outer conductive material in the area around the holes. Once the individual boards have been fabricated, they are stacked in a predetermined order and orientation with a suitable low temperature dielectric bonding ply (meaning that the bonding ply has a lower softening temperature than the circuit substrate material) positioned between each pair of layers. The dielectric bonding ply requires registered apertures therethrough which correspond to areas where the conductive layer of one substrate is to make an electrically conductive connection with the conductive layer of an adjacent substrate. Thus, the dielectric bonding ply integrally bonds adjacent boards together while providing electrical isolation and/or electrical connections between conductive layers of different boards. The assembly of the boards is then subjected to a cycle of heat and pressure to effect a bond between the various board layers.

While the method of U.S. Pat. No. 4,788,766 overcomes some of the problems in the prior art, this prior method has certain disadvantages including the requirement for a substrate which has a melting temperature above the melting temperature of the bonding ply. In other words, the prior patent necessitates the use of a low temperature bond ply which limits the thermal rating of the multi-layer circuit. In addition, this prior method necessitates registered apertures in the bonding ply (leading to alignment problems) and is limited to multilayer circuits having plated through holes.

U.S. Pat. No. 5,046,238 attempts to overcome these problems. This prior patent discloses a method wherein a plurality of circuit layers comprised of a dielectric substrate having a circuit formed thereon are stacked, one on top of the other. The dielectric substrate is composed of a polymeric material capable of undergoing fusion bonding such as a fluoropolymeric based substrate. Fusible conductive bonding material (e.g., solder) is applied on selected exposed circuit traces (prior to the stacking step) whereupon the entire stack is subjected to lamination under heat and pressure to simultaneously fuse all of the substrate and conductive layers together to form an integral multilayer circuit having solid conductive interconnects.

In the first embodiment of U.S. Pat. No. 5,046,238, the discrete circuit layers are each prepared by (1) forming traces and pads on a removable mandrel; (2) laminating a layer of dielectric to the circuit and mandrel; (3) forming an access opening at selected locations through the dielectric layer (using laser, plasma, ion etch or mechanical drilling techniques) to expose selected circuit locations; (4) forming conductive posts in the access openings to a level below the top of the access openings; and (5) providing a fusible conductive material in the access opening. Thereafter, a stack-up is made of a plurality of these discrete circuit layers so that the exposed fusible conductive material contacts selected locations on an adjacent circuit. This stack-up is then subjected to heat and pressure to simultaneously fuse both the several layers of dielectric substrate and fusible conductive material to provide a cohesive fused multilayer circuit board.

In the second embodiment of U.S. Pat. No. 5,046,238, at least one discrete circuit board is made using any suitable technique to define a fusible dielectric substrate having a circuit pattern thereon. Next, a layer of fusible dielectric material having openings through selected locations is placed on the circuit board so that selected locations on the circuit pattern are exposed. Thereafter, a plug of fusible conductive material (e.g., solder) is placed in the openings (using manual, mechanical or like techniques). Next, a second circuit board is stacked on the first board so that the plugs of fusible conductive material align with and contact selected locations on the circuit pattern of the second circuit board. This stack-up is then subjected to heat and pressure to simultaneously fuse both the layers of fusible dielectric and the fusible conductive material to provide a cohesive fused multilayer circuit board.

While the method of U.S. Pat. No. 5,046,238 overcomes some of the problems in the prior art, this prior art method has certain disadvantages including problems commonly encountered with spreading of the solder mass during lamination, and evolution of the flux medium necessary to deoxidize the solder. Further, spreading of the solder mass is dependent on the low viscosity of the solder, the amount of solder and the proximity of other circuit features. Also, it is difficult to evolve all of the flux compound from the internal layers of the printed circuit board thereby presenting a potential long-term reliability problem from residual organics. With continued microminiaturization of circuit features, it was desired to produce circuit boards with feature sizes smaller than that possible using solder.

Temperatures and pressures used for practical solid state bonding processes are typically well in excess of 300° C. and 1000 psi. Therefore, it is necessary for any dielectric material used to be stable at temperatures above 300° C. It will be appreciated that thermoplastic materials are generally not useful for fabricating very dense circuits with these harsh bonding conditions.

Fluoropolymers dielectric materials are often used for high frequency applications (>1 GHz) due to their low loss and tight dielectric constant control. Fluoropolymers such as polytetrafluoroethylene (PTFE), a copolymer of tetrafluorethylene and perfluoroalkyl vinyl ether (PFA) and a copolymer of hexafluoropropylene and tetrafluoroethylene (FEP) are also excellent circuit substrates due to their good thermal stability up to 400° C. and their good self-adhesion characteristics above their melt point. However, these materials generally have poor creep characteristics and yield poor dimensional stability when circuitized.

To register dense circuit features (traces <150 um and vias <200 um), it is essential that the dielectric material be dimensionally stable. This requires the tailoring of x-y thermal expansion to closely match the metallurgy (in most cases copper) of the circuit features. This must be accomplished without jeopardizing dielectric self-adhesion characteristics, adhesion to conductors or producing unacceptably high porosity.

Thermal compression bonding processes can be practiced at relatively low temperatures and moderate pressures as described in U.S. Pat. No. 3,923,231. However, the time required for bonding is extremely long (22–30 days) so these processes are generally not practical for printed circuit board or multichip module applications. To yield practical bonding times (<5 hour soak times), it is necessary to use relatively high temperatures (>300° C.) and pressures (>1000 psi). U.S. Pat. No. 4,874,721 describes a gold bonding process with pressures of about 2 kg/mm 2 (2800 psi) and 400° C. in 1 hour.

With fluoropolymers, these high temperatures and pressures can produce flow which distorts circuits and produces severe misregistration of individual circuit layers. This problem increases greatly as the density of circuit features increases.

SUMMARY OF THE INVENTION

The above discussed problems of the prior art are overcome or alleviated by the method of manufacturing a multilayer circuit of the present invention. In accordance with the present invention, a circuit assembly is manufactured in an additive process using at least one layer of a fluoropolymer composite material and a conductive material. The conductive layers are plated, and the fluoropolymer composite layers are laminated. The use of the filled fluoropolymer composite eliminates the need for a barrier layer between the insulation and the conductors.

A plurality of these circuit assemblies are stacked, one on top of the other. A diffusible conductive material (e.g., nobel metal) is applied at lead lines (or circuit traces) and vias wherever electrical connections are desired. Once stacked the circuits are subjected to lamination under heat and pressure to fuse adjacent fluoropolymer composite material and diffuse adjacent diffusible conductive material together to form an integral multilayer circuit having solid conductive interconnects. It may also be necessary, depending on conductive metal and noble metal combinations, to include a barrier metallization (i.e., nickel) to prevent diffusion of the conductive metal into the noble metal. Barrier metals are not required if both lead lines and vias are comprised of noble metal, as in the alternative embodiment.

The fluoropolymer composite dielectric material used in the MCM substrate of the present invention is preferably the material known as RO2800, available from Rogers Corporation, Rogers, Conn., the assignee of the present invention. That material is a thermoplastic polytetrafluoroethylene material with silane coated ceramic filler. That fluoropolymer material is set forth in more detail in commonly assigned U.S. Pat. Nos. 4,849,284 and 5,061,548, the entire contents of which are incorporated herein by reference. The thermoplastic nature of the material combined with a high filler content (preferably greater than 50 vol. % and most preferably greater than 60 vol. %) imparts a high viscosity at the melt temperature. Therefore, the material can be repeatedly remelted without losing dimensional stability during sequential manufacturing steps. Also, the dielectric material has a low modulus of elasticity (100–120 Kpsi) and a low CTE, thus resulting in low stress both during the manufacturing process and in the use of the resulting structure. Also, the material is characterized by low moisture absorption on the order of less 0.13%.

Dimensional stability of fluoropolymers can be greatly improved by incorporating high volume fractions of ceramic powder to reduce the thermal expansion of the composite so that it approximates that of the conductor metallurgy. High filler loadings also reduce dielectric flow. This is essential for the high temperature and pressure bonding processes required for practical thermal compression bonding processes. However, adding excessive amounts of filler will significantly degrade dielectric bond strength and yield a porous composite with poor circuit processing characteristics. A narrow window of fluoropolymer composite filler contents has been identified which provides acceptable dimensional stability and self-adhesion for application of practical solid state diffusion processes.

Fused amorphous silica contents between 55 vol % and 70 vol % in PTFE have been found to yield good dimensional stability with copper or gold conductors. The precise filler content for good dimensional stability does vary somewhat with particle size distribution and filler.

Other features and advantages of the present invention will be understood by those skilled in the art from the following detailed description and drawings.

BRIEF DESCRIPTION TO THE DRAWINGS

Referring now to the drawings, wherein like elements are numbered alike in the several FIGURES.

It will be understood that FIGS. 1 through 13 show part of a circuit in its process of manufacture. In these drawings, only one, or a few, of each type of via, lead lines, and/or voltage and ground planes is shown for purposes of illustration. It will, however, be understood that the number and type of lead lines, vias and/or voltage and ground planes will be determined by the specific design and function of any particular circuit.

DESCRIPTION OF THE PREFERRED EMBODIMENT

Figure 1:
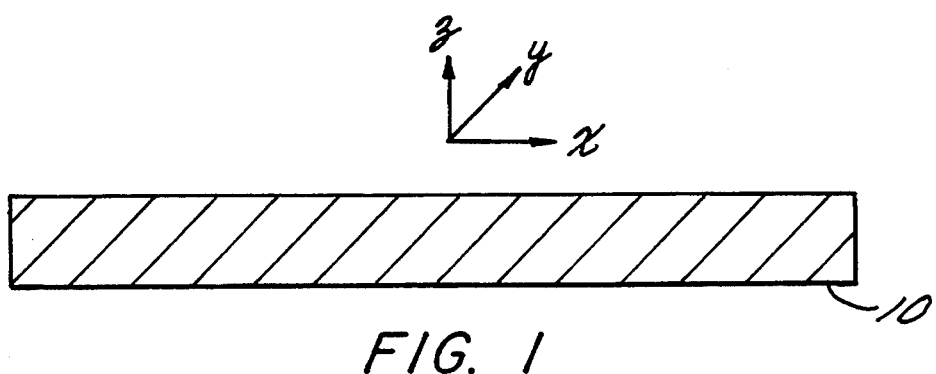
FIGS. 1–11 show various stages in the process of manufacture of a circuit assembly of the present invention.
Figure 2:
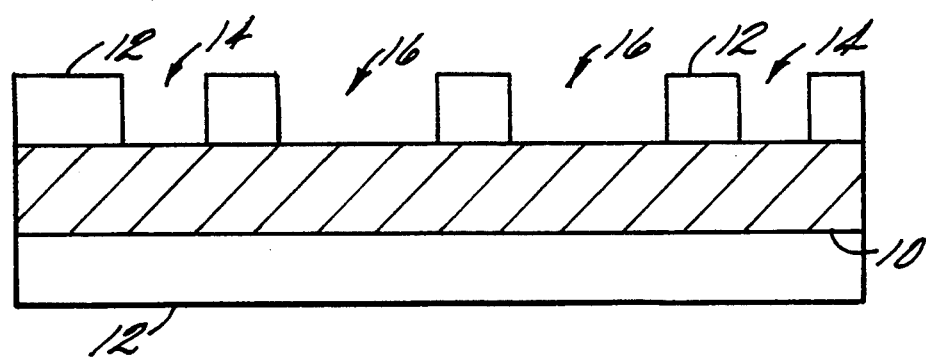

Referring to FIG. 1, the process of the present invention starts with a flat platform 10 on which one or more layers of the MCM substrate (or circuit assembly) is to be built, and which may form a part of the finished MCM substrate structure. This process may be the same as described in U.S. patent application Ser. No. 847,859 entitled Multichip Module Substrate and Method of Manufacture Thereof filed Mar. 9, 1992, the entire contents of which are incorporated herein by reference. The copper surface of platform 10, on which the MCM substrate is to be built, must be as flat as possible. Platform 10 can be a copper sheet, preferably of 2 mil thick copper foil with parallel flat opposed top and bottom surfaces. The platform could also be other material that is dimensionally stable in the x (horizontally in the plane of the drawing paper), y (into the plane of the paper) and z (vertically along the plane of the paper) directions; is flat; has a CTE approximately equal to or slightly less than that of copper, and can be etched or otherwise removed (e.g. laser ablation) at the point in the process where the copper foil is etched off. Platform 10 could also be a flat, rigid ceramic element, either featureless or cofired. Such a platform would end up as the outer layer in the final multilayer structure. In this example, platform 10 comprises a 2 mil thick treated copper foil having flat and parallel top and bottom surfaces.

Both surfaces of the platform 10 are coated with a layer 12 of photoresist material, preferably a dry film photoresist 1 mil thick. The photoresist layer 12 on the upper treated surface of the platform 10 is imaged and developed to define via sites 14 and lead line sites 16 (in this example, the portion of the lead line site 16 shown is in the "Y" direction), see FIG. 2. The photoresist layer 12 on the untreated bottom surface of the platform 10 is completely exposed (i.e., hardened) to form a protective layer during electroplating of the circuit features.

Figure 3:
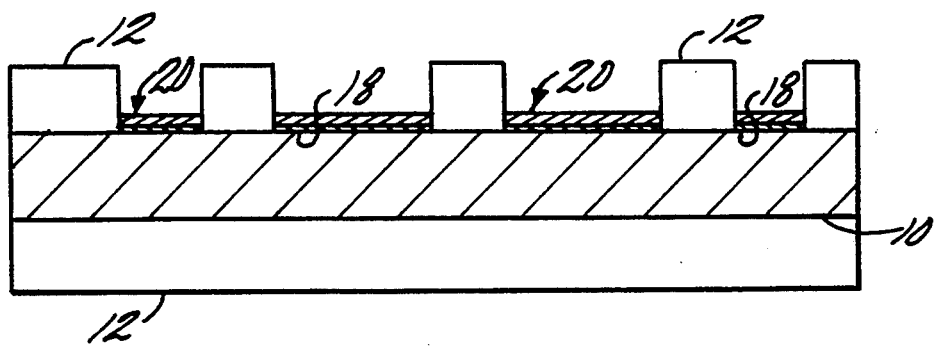

Next, referring to FIG. 3, a thin layer 18 of nickel is plated on platform 10 in the via sites 14 and lead line sites 16. Then a layer 20 of a noble metal (e.g., gold) or other suitable diffusible conductive material is electroplated on the layer 18 of nickel. Layer 18 of nickel prevents the diffusion of the copper of platform 10 into the gold of layer 20. This diffusion would otherwise degrade the later bondability of the gold. Alternatively, a thin layer of nickel may be deposited on platform 10 prior to coating with photoresist material 12, and then gold only would be plated into the via sites 14 and lead line sites 16. This embodiment may be preferred since it will ensure a more planar surface when the copper platform 10 and nickel layer 18 are etched, as described hereinafter.

Figure 4:
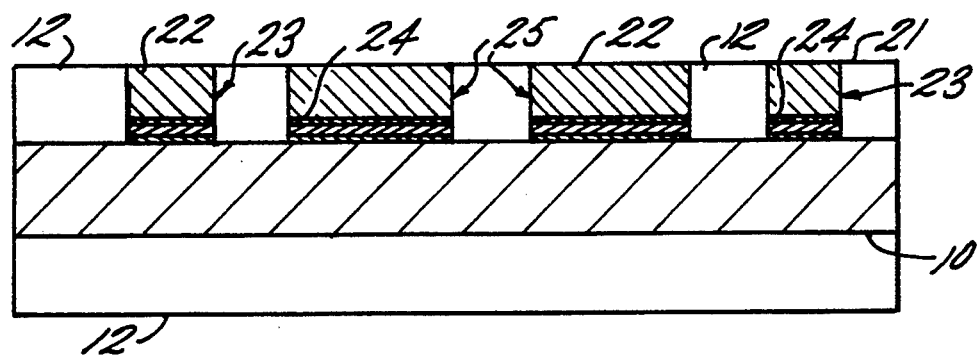

Referring to FIG. 4, the remaining thickness of the via sites 14 and lead line sites 16 are then electroplated with a layer 22 of copper, after plating another thin nickel (barrier) layer 24 on the gold layer 20. The copper plating of layer 22 is controlled so that the height of the plated features is equal to the height of the photoresist layer 12, see FIG. 4. Care must be taken so that the electroplated features do not 'mushroom' over the top surface of the photoresist layer 12. Layers 18, 20, 24 and 22 in via sites 14 form vias 23 and in lead line sites 16 form lead lines 25.

Figure 5:
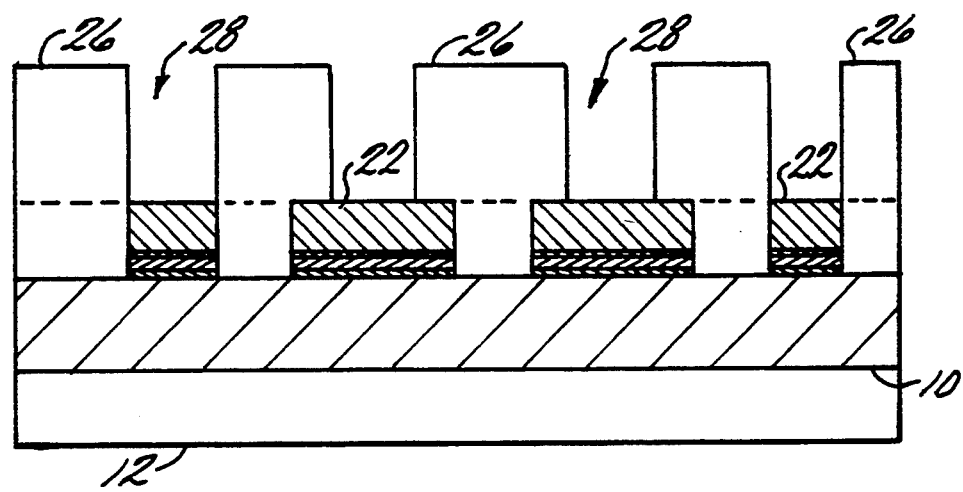
Figure 6:
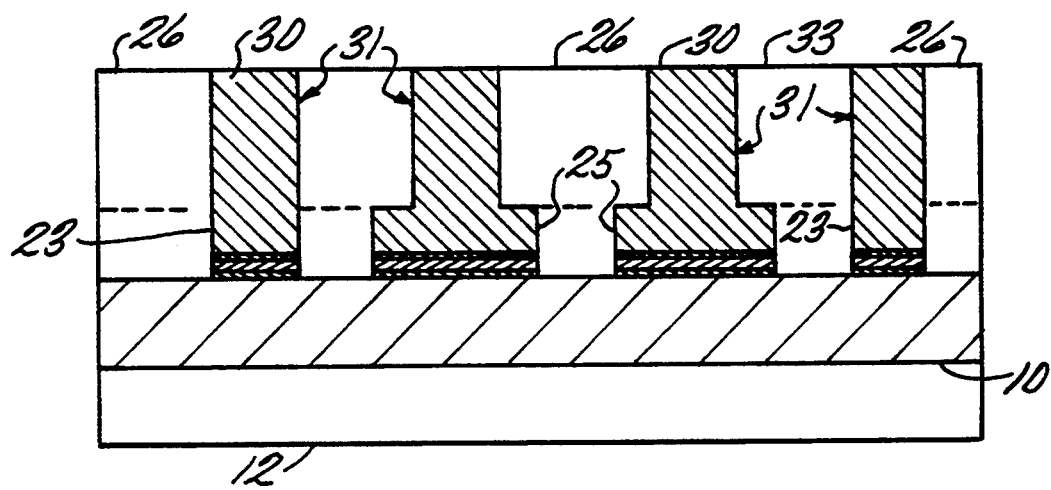

Next, another layer 26 of 2–3 mil photoresist is coated over the plated features (i.e., layer 22) and imaged and developed to produce via sites 28, see FIG. 5. The bottoms of the via sites 28 are argon/oxygen plasma cleaned to ensure that the subsequent via plating will adhere well to the surfaces of the copper of layer 22 below them.

The via sites 28 are then plated up with a layer 30 of copper to form vias 31. The plating of copper layer 30 is controlled so that the tops of vias 31 are at or just below the top surface 33 of the photoresist layer 26. Again, care is taken so that the electroplated features (i.e., layer 30) do not mushroom over the surface of the photoresist, see FIG. 6.

Figure 7:
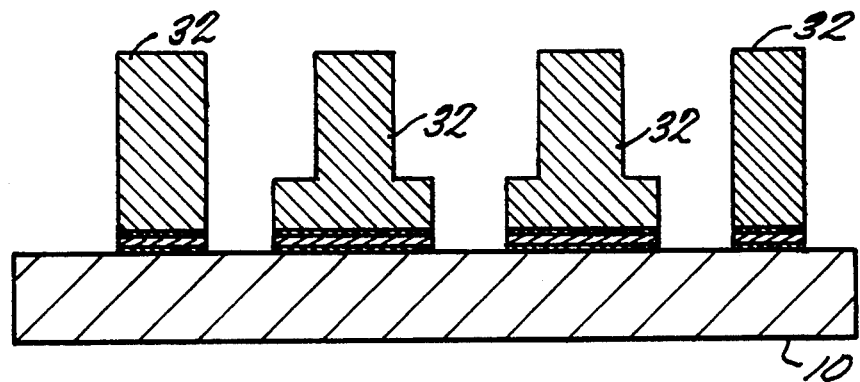

After the vias 31 have been formed (i.e., layer 30 has been plated up), all layers 26 and 12 of photoresist are removed to leave plated features 32 standing on the platform 10, see FIG. 7. Plated features 32 comprise nickel layer 18, gold layer 20, nickel layer 24, and copper layers 22 and 30. Any residual photoresist is removed preferably using an argon/oxygen plasma etch. It will be appreciated that this plasma etching step is used through the method of the present invention to remove residual photoresist.

Figure 8:
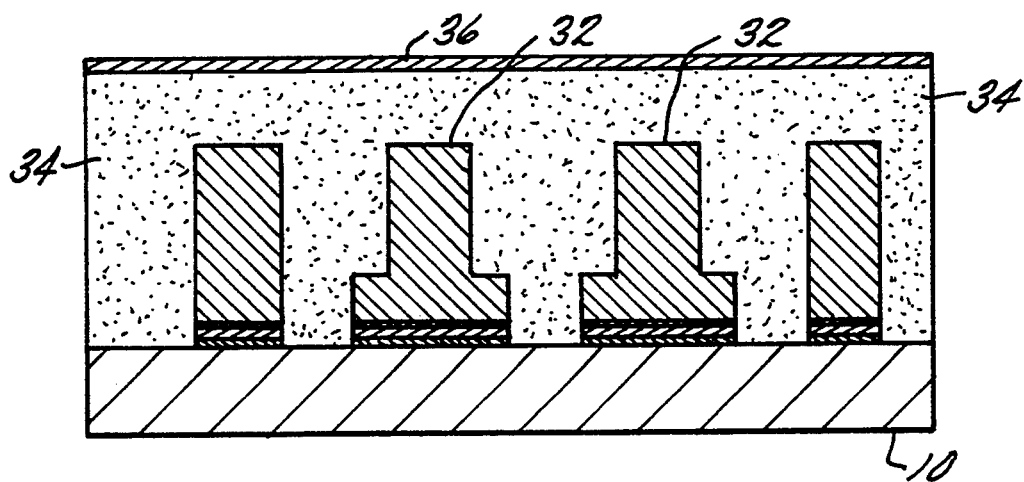

Next, referring to FIG. 8, a layer 34 of a fluoropolymeric material (e.g. Rogers Corporation RO2800 fluoropolymer) is deposited on top of the vias and lead lines 32 and laminated thereto. Fluoropolymer layer 34 may be from 2-10 mils thick, preferably 5-10 mils thick. It will be appreciated that the thinner the final dielectric thickness after flycutting, described below, the thinner the dielectric thickness needed in lamination. The fluoropolymer material preferably has a thin (e.g., 1 mil) top layer 36 of copper which services as a release layer during lamination. The fluoropolymer layer 34 is laminated to platform 10, with plated features 32 by a heat and pressure lamination process. In this lamination process, release layer 36 prevents the fluoropolymer layer 34 from sticking to a press pad, which in turn, is in contact with the press plate. The lamination process densities the fluoropolymer layer 34 in the z direction. However, the material is a highly filled and viscous polymer which does not flow laterally (x or y directions) under heat and pressure. Thus, the positioning and alignment of the vias and lead lines are not disturbed by lateral flow of the fluoropolymer of layer 34 during the lamination step.

The preferred process for effecting the lamination is as follows:
(a) Place the assembly (platform, vias, traces, fluoropolymer layer) in the press, close the press and apply a low pressure (about 100 psi) as heat is applied;
(b) ramp the temperature up to 700° F.;
(c) increase the pressure to 1700 psi;
(d) soak at 700° F. and 1700 psi for one hour;
(e) while maintaining 1700 psi, reduce temperature to 400° F.;
(f) at 400° F., reduce the pressure to 100 psi;
(g) cool to below 100° F. (or room temperature) at 100 psi;
(h) remove the assembly from the press.

After the laminated subassembly (see, FIG. 8) is removed from the press, copper release layer 36 is removed by etching. Platform 10 is protected from the etch during this etching step by, e.g., being coated with a photoresist which is removed after the etching step.

Figure 9:
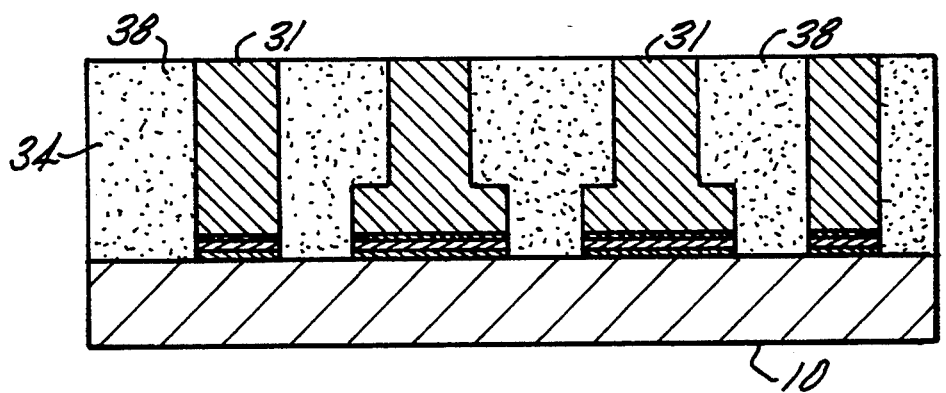

Next, the upper surface of the assembly is planarized by flycutting to (a) ensure general planarity (i.e., parallelism) with the upper surface of platform 10, and (b) to provide an upper surface 38 of the assembly where the vias 31 are exposed and are generally coplanar with each other and with the exposed upper surface 38 of laminated fluoropolymer layer 34, see FIG. 9.

The flycutting is performed as described in U.S. patent application Ser. No. 847,895. The subassembly is then removed from the flycutting machine and cleaned with a Freon or other degreasing material.

Figure 10:
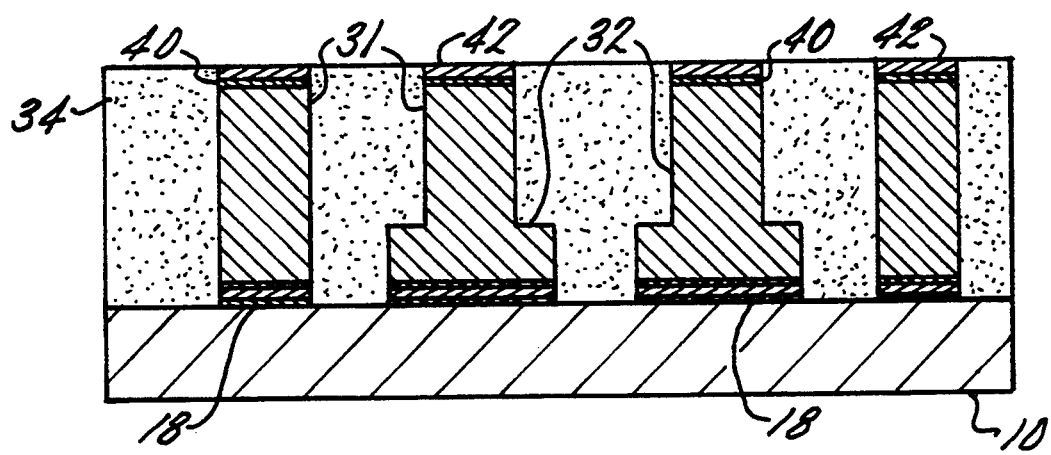
Figure 11:
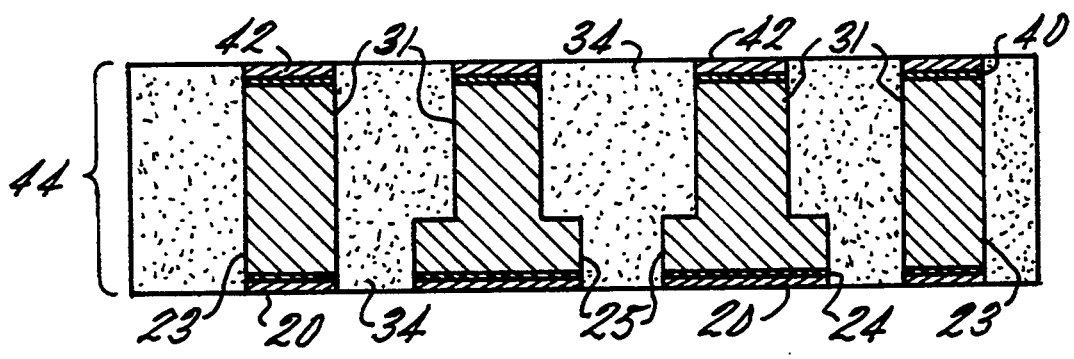

Next, a thin layer of barrier nickel 40 is plated on the exposed vias followed by the plating of another noble metal (e.g., gold) layer 42, see FIG. 10. It will be appreciated that during the flycutting step the fluoropolymer layer 34 tends to compress, such that after flycutting the via heights are actually slightly recessed. Therefore, when layers 40 and 42 are added the end result is very close to a planar surface and in some instances the gold may exceed the height of the fluoropolymer layer by a very small amount. Prior to these platings (a) the tops of the vias 31 are plasma cleaned to remove any fluoropolymer debris produced during flycutting, and (b) the bottom surface of the platform 10 is again coated with a layer of photoresist (not shown) to prevent plating on the backside of the platform, which is removed after the gold plating and prior to the etching (i.e., removal) of the platform 10 in the next step.

The final step to produce the individual circuit layer is to etch off the copper platform 10 and the nickel layer 18 beneath it. The resulting circuit 44, shown in FIG. 11, comprises fluoropolymeric dielectric layer 34 of a uniform thickness, with copper vias and lead lines 23, 25 and 31, the exposed surfaces of which are plated with fusible gold layers 20 and 42 (with nickel barrier layers 24 and 40, respectively) and are essentially flush with the surfaces of the dielectric layer 34. While circuit 44 has been described as a single layer circuit, the circuit may comprise more than one layer, as described in U.S. patent application Ser. No. 847,895.

A variation of the preceding circuit fabrication process is one in which, after plating the thin layer 18 of barrier nickel, see FIG. 3, the vias and lead lines are entirely built of a plated noble metal (e.g., gold), thereby eliminating all copper plating and subsequent nickel platings and the numerous metallic interfaces resulting from the multiple plating steps.

Figure 12:
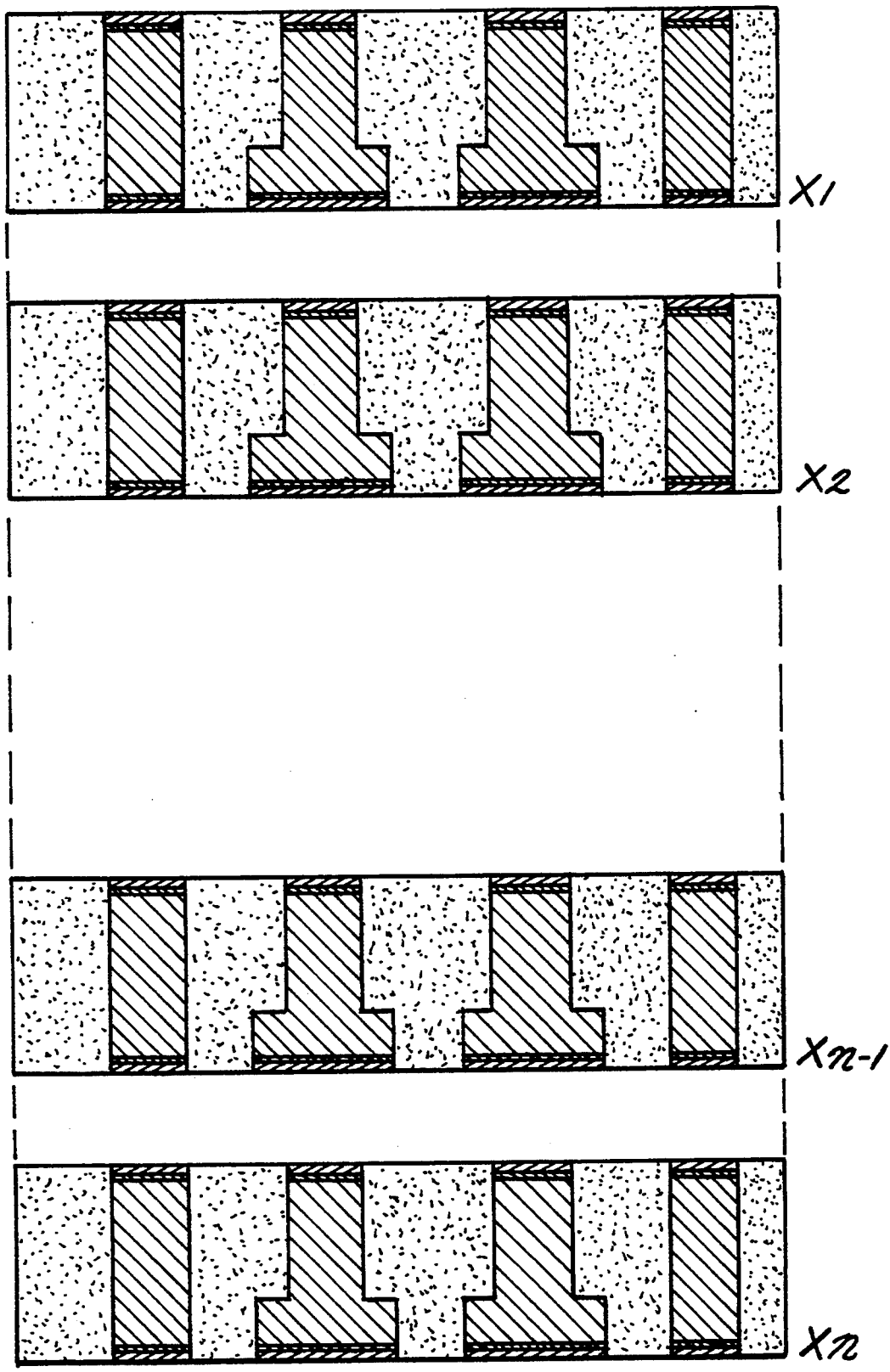
FIG. 12 is an exploded view depicting a stack-up of the circuit assemblies of the type shown in FIG. 11.

Turning now to FIG. 12, a plurality of circuit layers which have been fabricated in accordance with the techniques shown in FIGS. 1-11 are stacked one on top of the other in the manner shown. Of course, any number (Xn) of circuits may be stacked and registered with one another such that selected areas of the noble metal layers from adjacent circuits align. Prior to stacking these circuit layers for lamination, all surfaces to be diffusion bonded are argon plasma cleaned.

Figure 13:
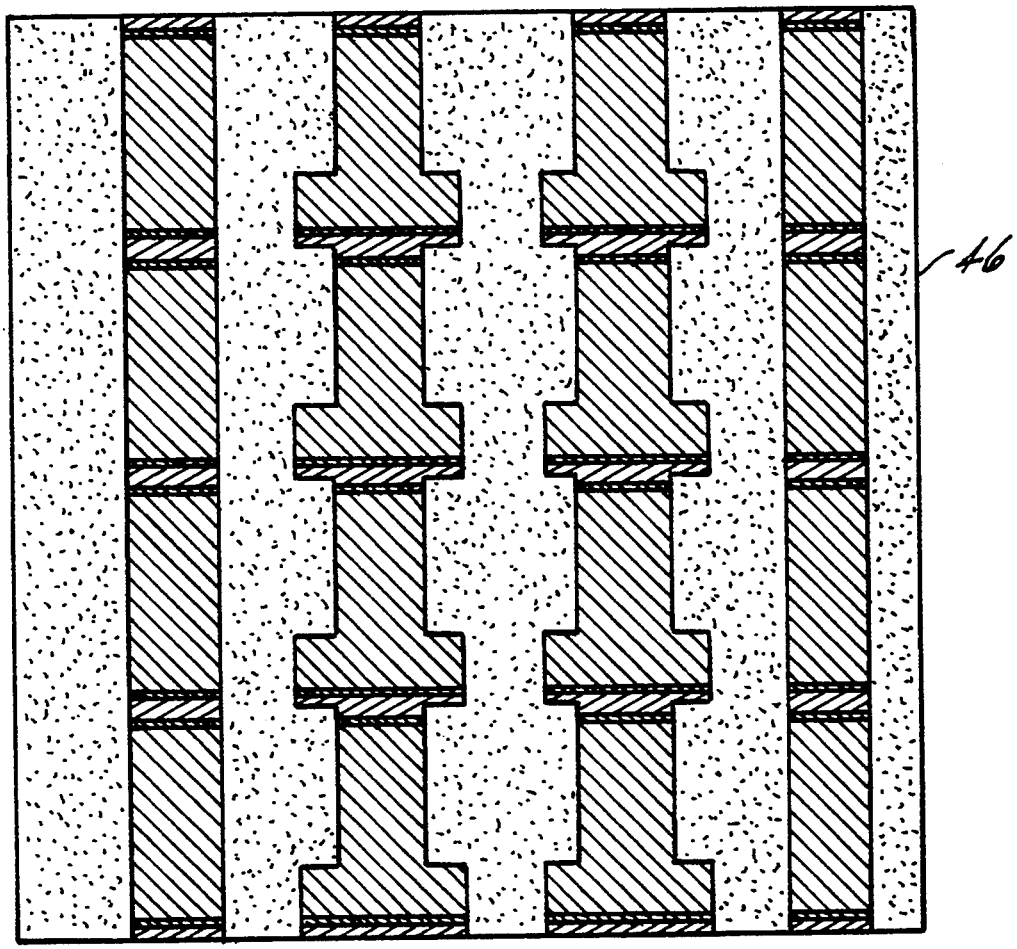
FIG. 13 is a cross-sectional elevation view of a final multilayer circuit made in accordance with the method of the present invention.

After the circuits have been stacked up as shown in FIG. 12, the stack up is subjected to lamination under sufficient heat (preferably less than 400° C.) and pressure, as described in U.S. patent application Ser. No. 939,105 entitled Method of Manufacturing a Multilayer Circuit Board filed Sep. 1, 1992, the entire contents of which are incorporated herein by reference, so as to fuse adjacent dielectric material and diffuse adjacent noble metal and thereby provide an integral and cohesive multilayer circuit assembly 46, as shown in FIG. 13 having solid conductive interconnects. By way of example, circuits were manufactured using the process of FIGS. 1-11 where: the diffusible conductive material was gold; the vias and traces were 501 $\mu$m and 25 $\mu$m wide, respectively; and the fluoropolymer was polytetrafluoroethylene (PTFE) filled with 60 volume percent 1 $\mu$m fused amorphous silica. These circuits were stacked as described above, thereafter the adjacent gold layers were diffused and adjacent dielectric layers were fused at 3700 and 1700 psi with a 1 hour soak time. This resulted in peel strengths which exceeded a 8 pli for both dielectric to dielectric and gold to gold bonds. Further, the 50 μm vias were well registered to each other.

In another embodiment, individual circuit layers made in the heretofore described embodiment may be alternated in a stack with double sided, plated-through-hole printed circuits made from the copper clad RO2800 dielectric by e.g. conventional, low cost subtractive printed circuit fabrication processes. The double sided circuits would, of course, have gold or other diffusible metallurgy on the outer surfaces where diffused conductive interconnects are to be made during the stack lamination. The stack lamination could be effected in the same manner as described earlier in U.S. patent application Ser. No. 939,105.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of forming a multilayer circuit comprising the steps of:
   providing at least two assemblies each of said first and second assemblies formed by the steps of,
   (1) selecting a planar platform having opposed mutually parallel surfaces,
   (2) forming first sites for a first part of a conductive circuit on a first of said surfaces of said platform,
   (3) plating in said first sites to form said first part of said conductive circuit in said first sites,
   (4) forming second sites for a second part of said conductive circuit on selected locations of said first part of said conductive circuit,
   (5) plating in said second sites to form said second part of said conductive circuit in said second sites,
   (6) laminating a layer of filled fluoropolymeric composite material onto said conductive circuit to define a laminated conductive circuit;
   (7) planarizing said laminated conductive circuit to expose selected locations of said conductive circuit and define a planarized surface, and
   wherein said conductive circuit includes a layer of a diffusible conductive material on at least one selected location thereof;
   stacking said at least two assemblies one on top of the other so that said at least one selected location of diffusible conductive material of said first assembly aligns with said at least one selected location of diffusible conductive material of said second assembly; and
   laminating said stacked assemblies under heat and pressure effective to both fuse said filled fluoropolymeric composite material and diffuse said diffusible conductive material so as to form a cohesive multilayer substrate having a solid conductive interconnect between said first and second assemblies, said solid conductive interconnect being defined by said diffusible conductive material.

2. The method of claim 1 wherein said steps of forming said first and second sites include the steps of:
   selectively depositing photoresist material;
   imaging said deposited photoresist material; and
   developing said imaged photoresist material to define said sites.

3. The method of claim 2 wherein said steps of plating said first and second parts of said conductive circuit include the step of:
   controlling the height of the conductive circuit to be about the same as the height of the photoresist.

4. The method of claim 1 wherein said layer of filled fluoropolymeric composite material includes a thin release layer on a top surface thereof.

5. The method of claim 1 wherein said filled fluoropolymeric composite material comprises:
   silane coated silica filled polytetrafluoroethylene.

6. The method of claim 1 wherein said step of laminating said layer of filled fluoropolymeric composite material comprises:
   (a) at a low pressure, ramping of the laminating temperature up to about 700° F;
   (b) increasing the pressure to 1700 p.s.i.;
   (c) soaking at about 700° F. and 1700 p.s.i.;
   (d) reducing the temperature to about 400° F. while maintaining a pressure of 1700 p.s.i.;
   (e) reducing the pressure to about 100 p.s.i. while maintaining the temperature of 400° F.; and
   (f) cooling to below 100° F. at a pressure of about 100 p.s.i..

7. The method of claim 1 wherein said step of planarizing said laminated conductive circuit comprises:
   a flycutting process.

8. The method of claim 7 wherein:
   said flycutting process utilizes a diamond cutting tool operated at a positive rake angle.

9. The method of claim 8 wherein:
   said positive rake angle is about 4°.

10. The method of claim 1 wherein said diffusible conductive material comprises a noble metal.

11. The method of claim 10 wherein said noble metal comprises gold.

12. The method of claim 1 wherein said planar platform comprises:
    a layer of copper; and
    a layer of nickel deposited on said layer of copper.

13. The method of claim 1 wherein the step of forming said first and second assemblies further comprises the step of:
    (8) removing said planar platform from said planarized laminated conductive circuit.

14. The method of claim 1 wherein said conductive circuit comprises diffusible conductive material.

15. The method of claim 14 wherein said diffusible conductive material comprises a noble metal.

16. The method of claim 15 wherein said noble metal comprises gold.

17. The method of claim 1 wherein:
    said step of plating said first sites comprises,
    plating a first layer of nickel on said planar platform within said first sites,
    plating a layer of gold on said first layer of nickel,
    plating a third layer of nickel on said second layer, and
    plating a fourth layer of copper of said third layer;
    said step of plating said second sites comprises,
    plating a fifth layer of copper on said fourth layer within said second sites; and
    said step of forming said first and second assemblies further comprises the step of,
    plating a sixth layer of nickel on said fifth layer after planarizing said laminated conductive circuit, and plating a seventh layer of gold on said sixth layer.

18. The method of claim 1 wherein said step of laminating said stacked assemblies under heat and pressure comprises a heat of less than 400° C.

19. A method of forming a multilayer circuit comprising the steps of:
providing a first circuit assembly formed by the steps of,
(1) selecting a planar platform having opposed mutually parallel surfaces,
(2) forming first sites for a first part of a conductive circuit on a first of said surfaces of said platform,
(3) plating in said first sites to form said first part of said conductive circuit in said first sites,
(4) forming second sites for a second part of said conductive circuit on selected locations of said first part of said conductive circuit,
(5) plating in said second sites to form said second part of said conductive circuit in said second sites,
(6) laminating a layer of filled fluoropolymeric composite material onto said conductive circuit to define a laminated conductive circuit,
(7) planarizing said laminated conductive circuit to expose selected locations of said conductive circuit and define a planarized surface, and
wherein conductive circuit includes a layer of a diffusible conductive material on at least one selected location thereof;
providing a second circuit assembly comprising a substrate of fusible dielectric material and a conductive circuit formed thereon and wherein said conductive circuit includes a layer of a diffusible conductive material on at least one selected location thereof;
stacking said first and second assemblies one on top of the other so that said at least one selected location of diffusible conductive material of said first assembly aligns with said at least one selected location of diffusible conductive material of said second assembly; and
laminating said stacked assemblies under heat and pressure effective to both fuse said filled fluoropolymeric composite material with said fusible dielectric material and diffuse said diffusible conductive material so as to form a cohesive multilayer substrate having a solid conductive interconnect between said first and second assemblies, said solid conductive interconnect being defined by said diffusible conductive material.

20. The method of claim 19 wherein said steps of forming said first and second sites include the steps of:
selectively depositing photoresist material;
imaging said deposited photoresist material; and
developing said imaged photoresist material to define said sites.

21. The method of claim 20 wherein said steps of plating said first and second parts of said conductive circuit include the step of:
controlling the height of the conductive circuit to be about the same as the height of the photoresist.

22. The method of claim 19 wherein said layer of filled fluoropolymeric composite material includes a thin release layer on a top surface thereof.

23. The method of claim 19 wherein said filled fluoropolymeric composite material comprises:
silane coated silica filled polytetrafluoroethylene.

24. The method of claim 19 wherein said step of laminating said layer of filled fluoropolymeric composite material comprises:
(a) at a low pressure, ramping of the laminating temperature up to about 700° F.;
(b) increasing the pressure to 1700 p.s.i.;
(c) soaking at about 700° F. and 1700 p.s.i.;
(d) reducing the temperature to about 400° F. while maintaining a pressure of 1700 p.s.i.;
(e) reducing the pressure to about 100 p.s.i. while maintaining the temperature of 400° F.; and
(f) cooling to below 100° F. at a pressure of about 100 p.s.i..

25. The method of claim 19 wherein said step of planarizing said laminated conductive circuit comprises:
a flycutting process.

26. The method of claim 25 wherein:
said flycutting process utilizes a diamond cutting tool operated at a positive rake angle.

27. The method of claim 26 wherein:
said positive rake angle is about 4°.

28. The method of claim 19 wherein said diffusible conductive material comprises a noble metal.

29. The method of claim 28 wherein said noble metal comprises gold.

30. The method of claim 19 wherein said planar platform comprises:
a layer of copper; and
a layer of nickel deposited on said layer of copper.

31. The method of claim 19 wherein the step of forming said first circuit assembly further comprises the step of:
(8) removing said planar platform from said planarized laminated conductive circuit.

32. The method of claim 19 wherein said conductive circuit comprises diffusible conductive material.

33. The method of claim 32 wherein said diffusible conductive material comprises a noble metal.

34. The method of claim 33 wherein said noble metal comprises gold.

35. The method of claim 19 wherein
said step of plating said first sites comprises,
plating a first layer of nickel on said planar platform within said first sites,
plating a layer of gold on said first layer of nickel,
plating a third layer of nickel on said second layer, and
plating a fourth layer of copper of said third layer;
said step of plating said second sites comprises,
plating a fifth layer of copper on said fourth layer within said second sites; and
said step of forming said first circuit assembly further comprises the step of,
plating a sixth layer of nickel on said fifth layer after planarizing said laminated conductive circuit, and
plating a seventh layer of gold on said sixth layer.

36. The method of claim 19 wherein said step of laminating said stacked assemblies under heat and pressure comprises a heat of less than 400° C.

* * * * *

UNITED STATES PATENT AND TRADEMARK OFFICE
CERTIFICATE OF CORRECTION

PATENT NO. : 5,440,805
DATED : Aug. 15, 1995
INVENTOR(S) : Robert C. Daigle et al It is certified that error appears in the above-identified patent and that said Letters Patent is hereby corrected as shown below:

Column 1 line 8 insert--5,-- between "No." and "287,619."

Column 6 line 4 delete "859" insert--895--

Column 7 line 37 delete "densities" insert--densifies--

Column 8 line 65 delete "501" insert--50--

Column 9 line 3 delete"3700" insert--370°--

Signed and Sealed this

Fifteenth Day of February, 2000

Attest:

Q. TODD DICKINSON

Attesting Officer        Commissioner of Patents and Trademarks